United States Patent
Weis et al.

(10) Patent No.: US 7,457,392 B2
(45) Date of Patent: Nov. 25, 2008

(54) DELAY LOCKED LOOP

(75) Inventors: Christian Weis, Germering (DE); Thomas Miller, München (DE); Patrick Heyne, München (DE)

(73) Assignee: Infineon Technologies AG, Munich (DE)

( * ) Notice: Subject to any disclaimer, the term of this patent is extended or adjusted under 35 U.S.C. 154(b) by 753 days.

(21) Appl. No.: 10/266,296

(22) Filed: Oct. 8, 2002

(65) Prior Publication Data

US 2003/0094984 A1 May 22, 2003

(30) Foreign Application Priority Data

Oct. 8, 2001 (DE) ............................... 101 49 584

(51) Int. Cl.
*H03D 3/24* (2006.01)
(52) U.S. Cl. .................... 375/376; 375/371; 375/373; 327/149; 327/150; 327/153; 327/156; 327/158; 327/159; 327/161
(58) Field of Classification Search .................. 327/158
See application file for complete search history.

(56) References Cited

U.S. PATENT DOCUMENTS

| | | | |
|---|---|---|---|
| 4,789,996 A | 12/1988 | Butcher | |
| 5,355,097 A | 10/1994 | Scott et al. | |
| 5,359,232 A | 10/1994 | Eitrheim et al. | |
| 5,465,076 A | 11/1995 | Yamauchi et al. | |
| 5,604,775 A | 2/1997 | Saitoh et al. | |
| 5,875,219 A | 2/1999 | Kim | |
| 6,242,954 B1 | 6/2001 | Taniguchi et al. | |
| 6,275,555 B1 * | 8/2001 | Song | 375/375 |
| 6,329,854 B1 | 12/2001 | Lee et al. | |
| 6,351,167 B1 * | 2/2002 | Hein et al. | 327/158 |
| 6,456,130 B1 * | 9/2002 | Schnell | 327/156 |
| 6,489,823 B2 * | 12/2002 | Iwamoto | 327/158 |
| 6,774,693 B2 * | 8/2004 | Carr | 327/276 |
| 6,795,931 B1 * | 9/2004 | LaBerge | 713/401 |
| 6,930,524 B2 * | 8/2005 | Drexler | 327/158 |
| 2001/0000426 A1 | 4/2001 | Sung et al. | |

(Continued)

FOREIGN PATENT DOCUMENTS

DE 43 27 116 A1 3/1994

(Continued)

OTHER PUBLICATIONS

Shigehiro Kuge et al.: "A 0.18 μm 256Mb DDR-SDRAM with Low-Cost Post-Mold-Tuning Method for DLL Replica", *2000 IEEE International Solid-State Circuits Conference*, 4 pgs., Order No. 07803-5853-8/00.

*Primary Examiner*—Curtis B Odom
(74) *Attorney, Agent, or Firm*—Laurence A. Greenberg; Werner H. Stemer; Ralph E. Locher

(57) ABSTRACT

A delay locked loop includes a first delay device for obtaining a fine setting and a downstream-connected second delay device for obtaining a coarse setting of the delay time. The control signals for controlling the respective delay devices are provided by synchronization latches, which receive a clock obtained by the output signal of the first delay device for obtaining the fine setting. The delay locked loop enables a linear operating behavior at a high operating frequency and is particularly suitable when a differential embodiment of the two delay devices is used.

9 Claims, 1 Drawing Sheet

U.S. PATENT DOCUMENTS

2001/0050585 A1   12/2001   Carr
2003/0012322 A1   1/2003   Partsch et al.

FOREIGN PATENT DOCUMENTS

DE    199 12 967 A1   3/2000
DE    199 30 167 A1   1/2001
DE    101 30 122 A1   1/2003

* cited by examiner

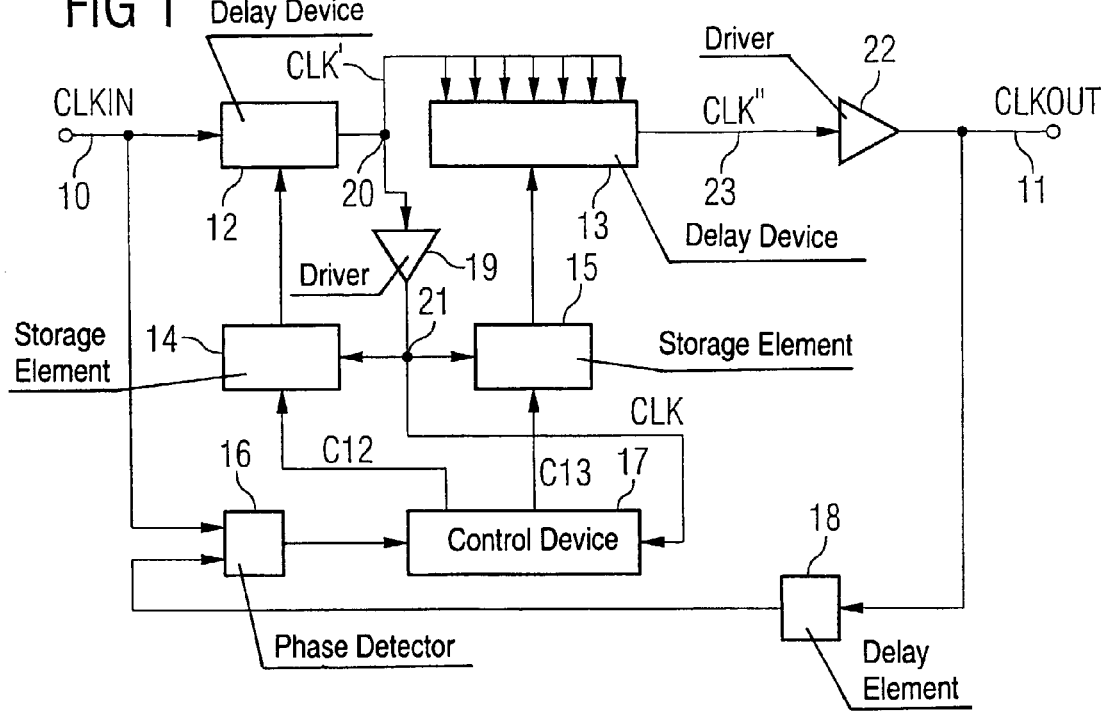
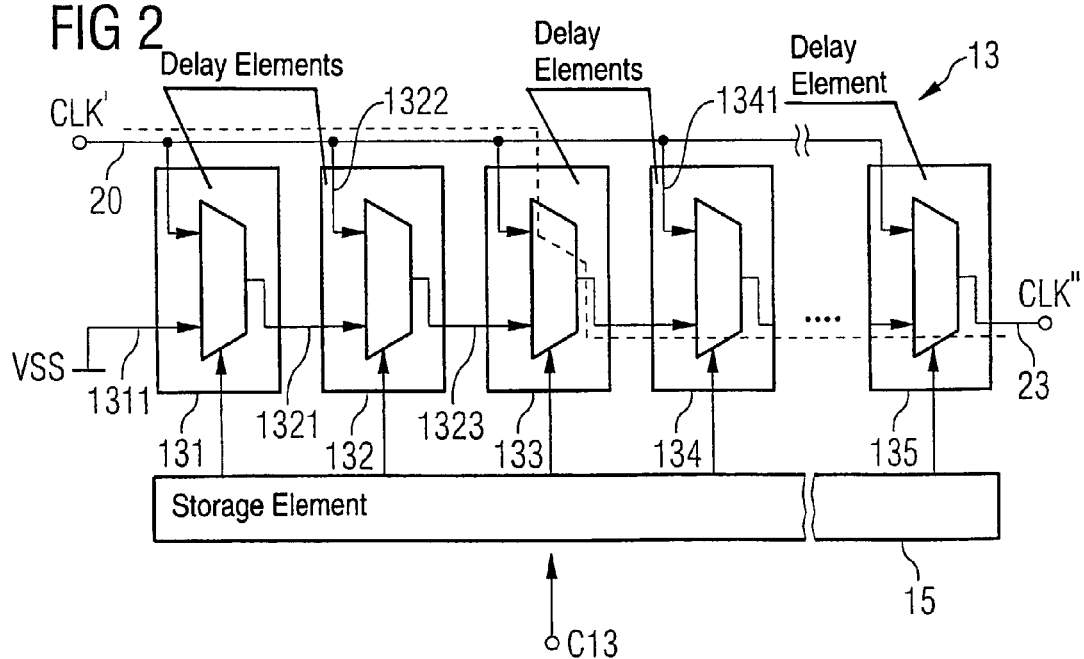

DELAY LOCKED LOOP

BACKGROUND OF THE INVENTION

Field of the Invention

The invention relates to a delay locked loop in which a delay device with a controllable delay time is connected between an input terminal for obtaining a signal to be delayed and an output terminal for providing a delayed signal. The delay time is set in a manner dependent on a phase difference between the input signal and the output signal.

Delay locked loops are used to delay an input clock signal using a control loop in such a way that the output signal has a predetermined phase angle. By way of example, such delay locked loops are provided in clock-controlled integrated circuits, for example, in synchronously operated dynamic semiconductor memories that operate according to double data rate principle DDR SDRAMs (Double Data Rate Synchronous Dynamic Random Access Memories). In that case, the data values that are read out are provided synchronously with a clock signal fed in to the input — to be precise both on the rising and on the falling edge of the clock signal. The phase locked loop takes account of the internal signal propagation times of the fed in clock signal and supplies the output driver with a suitably delayed clock signal in order to output the output data again synchronously with the clock signal present on the external data bus.

A delay locked loop (DLL) in a DDR SDRAM should have a low power loss, particularly in standby operation, and must be operable in a large operating frequency range. A low operating frequency requires that the delay device, contained in the control loop, have a long controllable delay time. Present-day concepts for a delay locked loop therefore provide a two-stage delay device, namely a delay device for the coarse setting of the delay time and a further, series-connected delay device for the fine setting of the delay time. FIG. 3 of published German Patent Application DE 199 30 167 describes a delay locked loop having two delay devices for the coarse setting of the delay time and for the fine setting of the delay time. The delay devices are connected in series with regard to the clock signal to be delayed. The delay device with the coarse setting is connected first in the signal path, and the delay device with the fine setting of the delay time is connected downstream. The control signals for setting the delay time, which are fed to the two delay devices, are provided in an appropriately timed manner to the delay devices by a storage element serving for synchronization, a so-called synchronization latch. The synchronization latch assigned to the coarse delay device is controlled by the output signal of this coarse delay device, and the synchronization latch assigned to the fine delay device is controlled by the output signal of the fine delay device. In addition, a further synchronization latch is connected upstream of the last-mentioned synchronization latch. The delay locked loop has the disadvantage of having a small control bandwidth on account of the long signal path from the control device to the fine delay unit via the two synchronization latches.

SUMMARY OF THE INVENTION

It is accordingly an object of the invention to provide a delay locked loop that overcomes the above-mentioned disadvantages of the prior art apparatus of this general type. In particular, an object of the invention is to provide a delay locked loop that has good control behavior even at high operating frequencies.

With the foregoing and other objects in view there is provided, in accordance with the invention, a delay locked loop, including: an input terminal for obtaining a clock signal that will be delayed; an output terminal for providing a delayed output clock signal; a first delay device with a first digitally controllable delay time having a step size, the first delay device having an output; a second delay device with a second digitally controllable delay time having a step size that is larger than the step size of the first delay time, the first delay device and the second delay device being connected in series between the input terminal and the output terminal, the second delay device being connected downstream of the first delay device; a control device for providing a first control signal to the first delay device and a second control signal to the second delay device in a manner dependent on a phase difference between the clock signal that will be delayed and the delayed output clock signal; a first clock-controllable storage element connected between the control device and the first delay device for feeding the first control signal to the first delay device; and a second clock-controllable storage element connected between the control device and the second delay device for feeding the second control signal to the second delay device. The first storage element and the second storage element each have a clock input coupled to the output of the first delay device.

In accordance with an added feature of the invention, the output of the first delay device is designed to provide a delayed signal that has been delayed by the first delay device; the second delay device has an input that obtains the delayed signal from the output of the first delay device; the output of the first delay device is connected to the input of the second delay device to define a node at a point of connection there between; and the clock input of the first storage element and the clock input of the second storage element are coupled to the node.

In accordance with an additional feature of the invention, there is provided, a driver connected between the node and the clock input of the first storage element. The driver is also connected between the node and the clock input of the second storage element.

In accordance with another feature of the invention, the second delay device includes a plurality of series-connected delay elements; each one of the plurality of the delay elements has an input; the second delay device has an input for obtaining an intermediate signal that will be delayed; the input of the second delay device can be connected to the input of one of the plurality of the delay elements in a manner dependent on the second control signal in order to forward the intermediate signal that will be delayed; and the second control signal controls the delay time of the second delay device.

In accordance with a further feature of the invention, each one of the plurality of the delay elements has an output; and in a manner dependent on the second control signal that controls the delay time of the second delay device, the output of at least one of the plurality of the delay elements is coupled to the input of the second delay device in order to forward the intermediate signal that will be delayed.

In accordance with a further added feature of the invention, the plurality of the delay elements are embodied as multiplexers; each one of the multiplexers has inputs and an output; the output of one of the multiplexers is connected to one of the inputs of a further one of the multiplexers; and another one of the inputs of the further one of the multiplexers is connected to the input of the second delay device.

In accordance with a further additional feature of the invention, the intermediate signal that will be delayed has a first part and a second part that is inverted with respect to the first part; and the plurality of the delay elements are of a differential design in order to simultaneously delay the first part of the intermediate signal that will be delayed and the second part of the intermediate signal that will be delayed.

In accordance with yet an added feature of the invention, the control device cyclically outputs the first control signal to the first delay device and cyclically outputs the second control signal to the second delay device; and the control device has a clock input coupled to the output of the first delay unit.

In accordance with yet an additional feature of the invention, there is provided, a common node for supplying an intermediate clock signal. The first storage element, the second storage element, and the control device are connected to the common node for obtaining the intermediate clock signal.

In accordance with yet a further feature of the invention, the digitally controllable delay time of the first delay device is limited by a maximum delay time that can be set by the first control signal; and the maximum delay time of the first delay device is equal to the step size of the digitally controllable delay time of the second delay device.

In the case of the delay locked loop, a first delay device for the fine setting of the delay time and a second delay device for the coarse setting of the delay time are connected into the signal path between the input terminal that receives the signal to be delayed and the output terminal that provides the delayed signal. What is significant is that the first delay device with the fine setting is arranged first in the signal path and the second delay device with the coarse setting is connected downstream of the first delay device. The clock signal that cyclically controls the synchronization latches can be tapped off at one point, namely the output of the first delay unit with the fine setting. Thus, while the synchronization latch for the first delay device is controlled cyclically by the output signal thereof, the synchronization latch for the second delay device is controlled cyclically by the input signal thereof. If the control signal of the control device, and accordingly, the delay time of the delay devices are to change, then the readjustment in the first and second delay devices acts on the same edge of the clock signal. This avoids distortions in the delayed output signal.

A driver is expediently provided between the tap of the control signal that cyclically controls the synchronization latches and the input of the synchronization latches.

The delay time of the second delay device with the coarse setting is effected by the activation or deactivation of delay elements that delay the input signal. In a particularly advantageous manner, such a cascading of delay elements is provided in which, in a manner dependent on the control signal, the input node at which the signal to be delayed is fed to the second delay device is varied in a manner dependent on the control signal. Thus, one of the inputs of one of the series-connected delay elements can be connected to the input of the second delay device, which input feeds in the signal to be delayed. The control signal that is fed via the synchronization latch defines which of the inputs of the multiplicity of delay elements is connected.

In a preferred refinement, the second delay unit has series-connected multiplexers. The output of a multiplexer that is connected upstream in the delay chain is connected to one of the outputs of a downstream-connected multiplexer. The other one of the inputs of each of the multiplexers is coupled to the input for feeding in the signal that will be delayed by the second delay device. In a manner dependent on the control signal fed in via the synchronization latch, one of the multiplexers is switched such that the input is connected to the input signal terminal of the second delay device. The other multiplexers connected downstream in the signal path are each connected to the output of the multiplexer connected upstream in the delay signal path.

In order for the delay time effected by the delay devices to be, as much as possible, independent of voltage fluctuations and current pulses, a differential embodiment of the first and second delay units is preferred. This means, that the signal that will be delayed is present as a first sub signal and an inverted second sub signal complementary thereto. First and second sub signals are jointly processed in a time-parallel manner by the delay devices. With a differential embodiment, it is particularly important that the control signal provided by the synchronization latches is already present after half a clock period of the clock signal that will be delayed. The short signal propagation time in the inventive circuit permits a maximum operating frequency of the delay locked loop.

The control circuit, which determines an actuating signal for the two delay devices in a manner dependent on the phase difference between the input clock signal that will be delayed and the output delayed clock signal, is also controlled by the same clock signal as the two synchronization latches. Overall, the digital actuators of the delay locked loop are operated clock-synchronously by the same clock signal.

In the case of the second delay device, which effects the coarse setting of the delay time, the delay time is effected by the input-side connection and disconnection of delay elements that are active in the signal path. The synchronization latch is likewise controlled by the input signal of the second delay device. However, the signal path for the connection or disconnection of a delay element via the assigned synchronization latch is longer than the signal path of the clock signal that will be delayed via the first delay element of the coarse delay device, so that a readjustment of the delay time within the coarse delay device is effected only when an edge that will be delayed has already traversed the delay element that will be connected or disconnected. The edge that effects the clock control of the synchronization latch has also already traversed the first delay device, which effects the fine setting of the delay time. Therefore, the readjustment of the delay time only acts on the next edge, which will be delayed, of the clock signal that will be delayed.

Preferably, the delay locked loop is realized as described with digitally controllable fine and coarse delay devices in a differential embodiment. The described embodiment of the clock driving of the synchronization latches and of the control device makes it possible to achieve a large operating range and a high operating frequency in conjunction with a reasonable power loss.

Other features which are considered as characteristic for the invention are set forth in the appended claims.

Although the invention is illustrated and described herein as embodied in a delay locked loop, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block diagram of an inventive delay locked loop; and

FIG. 2 is a block diagram of an exemplary embodiment of the second delay unit for coarsely setting the delay time of the delay locked loop in FIG. 1.

DESCRIPTION OF THE PREFERRED EMBODIMENTS

Referring now to the figures of the drawing in detail and first, particularly, to FIG. 1 thereof, there is shown a delay locked loop having an input terminal 10. A clock signal CLKIN that will be delayed is fed in to the input terminal 10. A delay device includes a first delay device 12 and a downstream-connected second delay device 13 that has an output connected to a driver 22 that provides a delayed clock signal CLKOUT at an output terminal 11. The output clock signal CLKOUT is fed back to a phase detector 16 via a delay element 18 with a constant delay time. The phase detector 16 compares this fed-back clock signal CLKOUT with the input clock signal CLKIN and outputs a signal representing the phase difference to a control device 17. Depending on magnitude and sign of the phase difference, the control device 17 generates control signals C12 and C13 so that the delay times of the first and second delay devices 12 and 13, respectively, are readjusted. The control is designed to correct the phase difference at the phase detector 16 to be as close to zero as possible. The control device 17 could possibly be a modified counter. The control signals C12, C13 are provided in an appropriately timed manner to the delay devices 12, 13 via storage elements 14 and 15, respectively.

The first delay device 12 effects a delay time that is controllable in fine steps in a manner dependent on the control signal C12. At the input, the input clock signal CLKIN that will be delayed is fed to the first delay device 12. The second delay device 13 is controllable in significantly coarser steps in a manner dependent on the control signal C13. The delay device 13 is connected downstream of the delay device 12, i.e. the output signal of the delay device 12 serves as the input signal of the delay device 13. So that the delay time effected by the series connected delay devices 12, 13, will have a linear modulation range — free of sudden phase changes — a full modulation of the first delay device 12 amounts to a delay time that is exactly the same as the smallest delay increment or decrement of the second delay device 13. If the delay element 12 overflows from a corresponding driving of the control signal C12, then the delay time of the second delay device 13 is incremented or decremented by one step depending on the control direction. The control word output by the control device 17 is divided into a less-significant portion C12, which is fed to the first delay device 12 for the fine setting, and a more-significant portion C13 which is fed to the second delay device 13 for the coarse setting.

The storage elements 14, 15 serving as synchronization latches are controlled cyclically and accept the actuating signals C12 and C13, respectively, with every rising edge, for example. The delay time in the first and second delay devices 12 and 13, respectively, is thereupon readjusted. The control signal that effects the clock control of the synchronization latches 14, 15 is tapped off at the output 20 of the first delay device 12. For better driver power, an additional driver 19 is connected downstream of the output 20. The output signal of the driver 19 jointly drives the clock inputs of the synchronization latches 14 and 15. The node 21 formed by the output of the driver 19 additionally feeds the clock signal CLK to the control device 17 for clock control. The control device 17 is designed as a counter, in principle. The elements 14, 15, 17 that are essential for controlling the control loop operate digitally, just like the first and second delay devices 12, 13.

The second delay device 13 is illustrated in detail in FIG. 2. A chain of delay elements is provided, which contains a multiplicity of delay elements that are connected in series one after the other. In a manner dependent on the control signal, selected ones of the delay elements are activated for obtaining the delay. The delay elements 131, 132, 133, 134, 135 are illustrated by way of example. The delay element 131 forms the beginning of the delay chain, and the delay element 135 forms the end of the delay chain. The delay elements are each embodied as a multiplexer. If the multiplexer 132 is considered, for example, then one input 1321 thereof is connected to the output of the multiplexer 131 that is connected upstream, while the other input 132 thereof is connected to the input 20 for the clock signal CLKIN that will be delayed by the second delay unit 13. The output 1323 of the multiplexer 132 is in turn connected to one of the inputs of the multiplexer 133 that is connected downstream. One of the inputs of all of the multiplexers are jointly connected to the input-side node 20 of the coarse delay device. The output of the last multiplexer 135 serves as the output 23 of the delay device 13. The input 1311 at the first multiplexer 131 is connected to a logic "0" or ground potential VSS. The setting of the multiplexers is determined by a respective bit of the control signal C13, which is provided by the storage element 15 that is supplied as a synchronization latch. The clock signal CLK' at the terminal 20, which clock signal will be delayed by the delay device 13, is thus fed in parallel to each of the multiplexers 131, ..., 135. Only one of the multiplexers, namely the multiplexer 133, is set such that it forwards the signal CLK' provided at the terminal 20 to its output and introduces it into the delay chain. All of the other multiplexers are put into the other state, so that they only forward the signal output by the upstream-connected multiplexer to their output.

An edge of the clock signal CLK' that is present at the output of the first delay device 12 for the fine setting is also provided as the input signal of the second delay device 13 serving for the coarse setting. This edge of the clock signal CLK' also simultaneously controls the synchronization latches 14, 15. If the delay time of the delay device 13 will be readjusted after an overflow of the delay device 12, this means that a coarse stage of additional delay time will be activated. On the one hand, when an active delay stage is connected, the signal input 1322 of the multiplexer 132 that is connected to the circuit input 20 is selected and the input of the multiplexer 133 that is connected to the output 1323 of the multiplexer 132 is selected. On the other hand, when an active delay stage is disconnected, the terminal 20 is fed into the delay chain via the activation of the input 1341 of the multiplexer 134.

Since the alteration in delay time is effected at the input of the second delay device 13 by connecting or disconnecting a delay element that is active for the delay time, an edge of the clock signal CLK' that will be delayed by the delay device 13 has already traversed the elements 132 to 134 before the synchronization latch 15 forwards the new actuating signal to the delay device 13 and triggers the switching operations just described. Controlling the synchronization latches 14, 15 by using the output signal CLK' of the first delay device 12, which effects the fine setting, means that, on one hand, a new actuating signal C12 or C13, respectively, is accepted into the synchronization latches early and as rapidly as possible. This guarantees a high operation frequency. On the other hand, this acceptance into the synchronization latch 15 is nonetheless effected so late that an edge fed into the second delay device 13 is no longer altered by an alteration of the actuating signal C13. Therefore, a readjustment of the delay time always acts on the same edge of the clock signal CLKIN that will be delayed. Therefore, the control operates in a manner free that is from jitter even at high frequencies.

The signal CLKIN is preferably of a differential embodiment (not illustrated in the drawings) and includes a first signal portion and a second signal portion that is complementary to the first signal portion, i.e. inverted. The delay device 12 and also the delay device 13 and the multiplexers thereof illustrated in FIG. 2 and also the driving thereof by the signals C12, C13 are implemented differentially. Here, in particular, the control signals C12, C13 must be quickly changed over, since a stable setting state must be reached as early as after half a clock period.

We claim:

1. A delay locked loop, comprising:
   an input terminal for obtaining a clock signal that will be delayed;
   an output terminal for providing a delayed output clock signal;
   a first delay device with a first digitally controllable delay time having a step size, said first delay device having an output;
   a second delay device with a second digitally controllable delay time having a step size that is larger than the step size of the first delay time, said first delay device and said second delay device being connected in series between said input terminal and said output terminal, said second delay device being connected downstream of said first delay device;
   a control device for providing a first control signal to said first delay device and a second control signal to said second delay device in a manner dependent on a phase difference between the clock signal that will be delayed and the delayed output clock signal;
   a first clock-controllable storage element connected between said control device and said first delay device for feeding the first control signal to said first delay device;
   a second clock-controllable storage element connected between said control device and said second delay device for feeding the second control signal to said second delay device;
   said first storage element and said second storage element each having a clock input coupled to said output of said first delay device;
   said output of said first delay device being designed to provide a delayed signal that has been delayed by said first delay device;
   said second delay device having an input that receives the delayed signal from said output of said first delay device;
   said second delay device including a plurality of multiplexers each having a first input and a second input and an output;
   said outputs of said plurality of multiplexers in each case being connected to said first input of another of said plurality of multiplexers; and
   the second inputs of said plurality of multiplexers in each case being connected to said input of said second delay device.

2. The delay locked loop according to claim 1, wherein:
   said output of said first delay device is connected to said input of said second delay device to define a node at a point of connection therebetween; and
   said clock input of said first storage element and said clock input of said second storage element are coupled to said node.

3. The delay locked loop according to claim 2, comprising:
   a driver connected between said node and said clock input of said first storage element;
   said driver also being connected between said node and said clock input of said second storage element.

4. The delay locked loop according to claim 1, wherein:
   said second delay device includes an input for an intermediate signal that will be delayed, said intermediate signal having a first part and a second part that is inverted with respect to the first part; and
   said plurality of said multiplexers are of a differential design in order to simultaneously delay the first part of the intermediate signal that will be delayed and the second part of the intermediate signal that will be delayed.

5. The delay locked loop according to claim 1, wherein:
   said control device cyclically outputs the first control signal to said first delay device and cyclically outputs the second control signal to said second delay device; and
   said control device has a clock input coupled to said output of said first delay unit.

6. The delay locked loop according to claim 1, comprising:
   a common node for supplying an intermediate clock signal;
   said first storage element, said second storage element, and said control device connected to said common node for obtaining the intermediate clock signal.

7. The delay locked loop according to claim 1, wherein:
   the digitally controllable delay time of said first delay device is limited by a maximum delay time that can be set by the first control signal; and
   the maximum delay time of said first delay device is equal to the step size of the digitally controllable delay time of said second delay device.

8. The delay locked loop according to claim 1, wherein said second clock-controllable storage element is directly connected between said control device and said second delay device for feeding the second control signal directly to said second delay device.

9. The delay locked loop according to claim 1, wherein said second clock-controllable storage element is connected between said control device and said second delay device, without any intervening clock-controllable storage element, for feeding the second control signal to said second delay device.

* * * * *